(12) United States Patent
Indyk et al.

(10) Patent No.: US 7,897,059 B2
(45) Date of Patent: Mar. 1, 2011

(54) HIGH TIN SOLDER ETCHING SOLUTION

(75) Inventors: Richard F. Indyk, Wappingers Falls, NY (US); Krystyna W. Semkow, Poughquag, NY (US)

(73) Assignee: International Business Machines Corporation, Armonk, NY (US)

(*) Notice: Subject to any disclaimer, the term of this patent is extended or adjusted under 35 U.S.C. 154(b) by 686 days.

(21) Appl. No.: 11/937,646

(22) Filed: Nov. 9, 2007

(65) Prior Publication Data
US 2009/0120999 A1  May 14, 2009

(51) Int. Cl.
*C03C 15/00* (2006.01)
(52) U.S. Cl. .......................... 216/103; 216/83; 134/1.2; 257/779
(58) Field of Classification Search ............. 216/83, 216/103, 104, 105; 134/1.2, 1.3; 257/779, 257/778
See application file for complete search history.

(56) References Cited

U.S. PATENT DOCUMENTS

| 4,051,001 | A  | * | 9/1977  | Inoue et al. ............... 216/93 |
| 4,448,804 | A  | * | 5/1984  | Amelio et al. ............. 430/314 |
| 6,852,152 | B2 | * | 2/2005  | Galasco et al. ........... 106/1.11 |
| 6,902,869 | B2 | * | 6/2005  | Appelt et al. ............. 430/311 |
| 2006/0196761 | A1 |  | 9/2006  | Zhao et al. |
| 2006/0199394 | A1 |  | 9/2006  | Takahashi et al. |
| 2007/0290367 | A1 | * | 12/2007 | Hwang ..................... 257/778 |

* cited by examiner

*Primary Examiner*—Lan Vinh
(74) *Attorney, Agent, or Firm*—DeLio & Peterson, LLC; Kelly M. Nowak; Joseph Petrokaitis

(57) ABSTRACT

A method is provided for the removal of tin or tin alloys from substrates such as the removal of residual tin solder from the molds used in the making of interconnect solder bumps on a wafer or other electronic device. The method is particularly useful for the well-known C4NP interconnect technology and uses an etchant composition comprising cupric ions and HCl. Cupric chloride and cupric sulfate are preferred. A preferred method regenerates cupric ions by bubbling air or oxygen through the etchant solution during the cleaning process.

18 Claims, 3 Drawing Sheets

HIGH TIN SOLDER ETCHING SOLUTION

BACKGROUND OF THE INVENTION

1. Field of the Invention

The present invention relates to the removal of tin or tin alloys from substrates and, in particular, to the making of interconnect solder bumps on a wafer or other electronic device using methods such as the well-known C4NP interconnect technology in which residual tin or tin alloy is removed from the transfer molds used in the C4NP method.

2. Description of Related Art

While the method of the invention is applicable to the removal of tin or tin alloy from any substrate the invention will be described for convenience to the removal of high tin composition solder from electronic substrates and in particular from the transfer molds used in the C4NP interconnect technology method.

Forming an electronic package assembly whereby an electrical component such as an integrated circuit chip is electrically and mechanically connected to a substrate, a card, or board, another chip or another electronic part is well known in the art. This technology is generally termed surface mount technology (SMT) and has gained acceptance as the preferred means of making electronic package assemblies. The interconnect technology is commonly known as ball grid array packaging, C4 flip chip interconnect, multi-chip modules, multilayer and micro via printed wiring boards and surface mount hybrid assembly.

Multilayer ceramic and organic electronic components are typically joined to other components by metallic termination (or capture) pads on a surface of one of the electronic components to corresponding metallic termination (or capture) pads on the surface of the other component. Control Collapse Chip Connection is an interconnect technology developed by IBM as an alternative to bonding devices to substrates with discreet wires, known in the art as wirebonding. This technology is generally known as C4 technology or flip chip packaging. Broadly stated, an integrated circuit chip is mounted above a ceramic or organic substrate and pads on the chip are electrically and mechanically connected to corresponding pads on the substrate by a plurality of electrical connections such as solder bumps to form an electronically connected module. A module is typically connected to other electronic components by solder or socket type connections.

In the C4 interconnect technology a relatively small solder bump is attached to the pads on one of the components being joined, typically to the chip. The electrical and mechanical interconnects are then formed by positioning the corresponding pads on the substrate to be joined adjacent the solder bumps on the chip and reflowing the bumps at an elevated temperature. The C4 joining process is self-aligning in that the wetting action of the solder will align the chip bump pattern to the corresponding pads on the substrate.

Capture pads for C4 bumps on semiconductor wafers or on the substrate to be interconnected are well-known and are typically made by a through resist plating of Ni or Cu/Ni pads onto a Cu seed layer. It is also preferred to use a conductive barrier layer on the substrate surface and the Cu seed layer is preferably made by sputtering of Cu onto a sputtered TiW layer. Capture pads can also be fabricated by a blanket metal sputtering process with the blanket film subsequently etched without any plating process involved.

In C4 technology the solder bumps are formed directly on the capture pads of the one unit. The pads are electrically isolated from other pads by the insulating chip passivation and substrate that surrounds each pad. The substrate may be un-doped silicon (Si) or some other material. The bottom of the pad is electrically connected into the chip or substrate circuit.

A major application of C4 is in joining semiconductor microchips (integrated circuits) to chip packages. Chips usually are made in rectangular arrays on a mono-crystalline slab of silicon called a "wafer," which is a thin disc several inches across. Many chips are formed on each wafer, and then the wafer is diced into individual chips and the chips are "packaged" in units large enough to be handled. The C4 bumps are placed on the chips while they are still joined in a wafer.

One method of forming solder bumps uses sputtering or vacuum deposition. Solder metal is evaporated in a vacuum chamber and the metal vapor coats everything in the chamber with a thin film of the evaporated metal. To form solder bumps on the substrate, the vapor is allowed to pass through holes in a metal mask held over the substrate. The solder vapor passing through the holes condenses onto the cool surface into solder bumps. This method requires a high vacuum chamber to hold the substrate, mask, and flash evaporator. Wafers are then subjected to elevated temperatures to reflow the solder into the desired spherical bump shape.

An alternative technique for making solder bumps is electrodeposition, also called electrochemical plating or electroplating. This method also uses a mask such as patterned photoresist and forms solder bumps only at the selected sites. Other methods include screening a solder paste through a mask and depositing micro-bumps in place. High temperature reflow processes are required for all of these bump-forming methods.

The C4NP transfer process is the preferred solder bump formation method and uses a mold having a plurality of openings (cavities) corresponding to the capture pads of the wafer. These openings are filled with the solder. The solder in the mold is then transferred to the capture pads of the wafer and upon heating forms solder bumps on the wafer pads. The mold openings are preferably filled with solder by an Injection Molding Solder (IMS) method as described below.

Residual tin-rich solder can remain in the mold cavities and must be removed from the mold surface and mold openings prior to refilling the mold with solder for the next usage. This has presented a problem to the industry.

Commercially available tin stripping solutions (Eliminator made by McDermid Inc. and NPS 3000 made by RBP Corp.) are typically formulated with nitric acid ($HNO_3$) as a primary component. Since etching with $HNO_3$ alone will result in the formation of insoluble metastannic acid ($H_2SnO_3$) which would require a subsequent chemical step to remove it from the workpiece, secondary components (ferric nitrate, ferric chloride and hydrochloric acid) are added to the etching solutions to hold the tin in solution. The typical holding capacity of these solutions is about 120 g/l. A further limitation of these solutions is that $H_2$ gas is evolved during the tin etch process and in addition to safety precautions required in a high volume production operation, bubble formation on the tin surface being etched leads to non-uniformity in the etching rate across the entire surface if these bubbles are not freely liberated.

Another known solution in which tin is readily dissolved is concentrated hydrochloric acid (HCl). This solution suffers the same problem as the $HNO_3$ based solutions in that $H_2$ gas is evolved and e.g., in the case of high tin solder composition etching, insoluble intermetallic precipitates (CuSn, AgSn) form which must be removed by another process step. The bath life of a concentrated HCl solution is also severely limited due to the high vapor pressure of HCl. Both the gas evolution and the insoluble precipitate formation render these solutions more appropriate for a spray etch process as opposed to an immersion process but spray etching has a negative environmental side effect in that volatilization of the acids is increased, resulting in additional emissions. Tool materials of construction are also a major concern when processing with high concentration HCl solutions.

Cupric chloride/HCl solutions are well-known for etching copper in electronic component manufacture is shown in U.S. Publication No. US2006/0199394 published Sep. 7, 2006. A method for the regeneration of cupric etching solutions is shown in U.S. Publication No. US2006/0196761 also published Sep. 7, 2006.

Bearing in mind the deficiencies of the prior art it is an object of the present invention to improve the C4NP process and, in particular, cleaning of the solder transfer molds to remove residual high concentration tin solder from the C4NP solder molds after the solder transfer step.

It is another object of the present invention to remove tin or tin alloys from substrates such as electronic substrates.

Still other objects and advantages of the invention will in part be obvious and will in part be apparent from the specification.

SUMMARY OF THE INVENTION

The above and other objects, which will be apparent to those skilled in the art, are achieved in the present invention which is directed to a method for removing tin or tin alloy residues from a substrate comprising the steps of:
  providing a substrate containing tin or tin alloy residues; and
  contacting the substrate with an aqueous composition comprising cupric ions, preferably cupric chloride or copper sulfate, and HCl for an effective time and temperature to remove the tin or tin alloy residues from the substrate.

In another aspect of the invention a method is provided for removing tin solder residues from molds used in solder transfer processes such as the C4NP process comprising the steps of:
  providing a mold containing an array of openings (cavities) corresponding to an array of capture pads on a substrate surface such as a wafer surface, the openings being filled with a solder containing a high percentage of tin;
  positioning the openings in the mold and the capture pads of the substrate surface so that the solder in the mold can be transferred to the corresponding capture pad on the substrate;
  transferring the solder in the mold to the corresponding capture pads of the substrate leaving an essentially empty mold;
  removing the empty mold from the substrate; and
  removing residual tin solder from the mold by contacting the empty mold with an aqueous composition comprising cupric ions, preferably cupric chloride or cupric sulfate, and HCl for an effective time and temperature to remove the tin solder residues from the mold.

In a further aspect of the invention the aqueous composition for removing residual tin solder or tin or tin alloys from a substrate such as a mold used in the C4NP process comprises:
  cupric ions, preferably CuCl2 or $CuSO_4$, in an amount of about 0.5 to 3 M or higher, preferably about 0.5 to 1 M, e.g., 0.75 M; and
  HCl in an amount of about 0.5 to 4 M or higher, preferably about 2 to 3 M, e.g., 3 M.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-3D of the drawings in which like numerals refer to like features of the invention.

Solder transfer molds using various solders containing tin may be readily processed using the method of the invention and the solders include lead-free binary, ternary and quaternary alloys. Lead-free alloys are of particular commercial significance and for convenience, the following description will be directed to such lead-free alloys, although it will be appreciated by those skilled in the art that any suitable solder may be readily processed using the method of the invention. Exemplary lead-free alloys include Sn-3.8% Ag-0.7% Cu, Sn-1.8% Ag, Sn-0.5% Ag and Sn-0.7% Cu. Also, in particular, the following description will be directed to tin containing lead-free alloys since these are likewise of significant commercial interest and an efficient method of providing solder interconnects with these alloys is of important commercial consideration.

Figure 1:
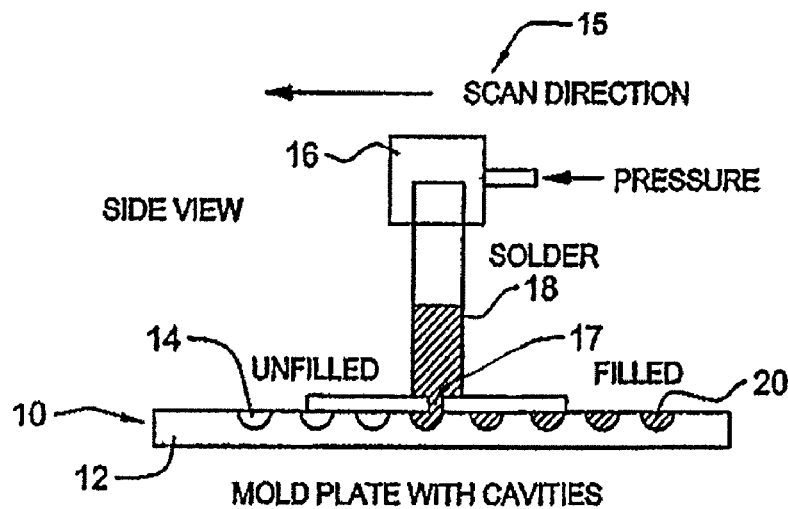
FIG. 1 is a schematic diagram showing filling of the mold plate with solder using injection molding.

IMS is the preferred method to make mold plates containing cavities which are filled with solder and a preferred transfer device for use in the method is shown in FIG. 1. FIG. 1 shows a mold 10 comprising a mold substrate 12 having solder openings or cavities 14. An IMS apparatus shown generally as 15 comprises an injection device 16 containing molten solder 18 therein. In operation, the IMS apparatus 16 is filled with molten solder 18 and moves in relation to the cavity containing mold plate 12, both of which are usually above solder liquidus temperature. As the apparatus scans across the mold plate in the direction of the arrow, the solder 18 from the reservoir, under constant pressure, passes through a dispensing slot 17 and into the solder openings 14 filling the openings to form solder filled openings 20. After the scanning process, the mold plate 12 is cooled to solidify the solder. It is then inspected, which can be done using various automated optical techniques. After inspection, the mold plates may be either immediately sent for transfer of the solder to the wafer or other substrate or stored in a non-oxidizing environment.

The mold plates can be made from a variety of materials and is typically glass.

Cavities (the solder openings) 14 in the mold plate are in a pattern array and are the mirror image of the solder receiving pads on the final substrate such as the wafer. The cavities can be produced in a mold plate by any number of techniques, the selection of which is dependent upon the cavity size and pitch as well as the mold plate material. Cavity volume uniformity is essential since they directly determine the solder bump volume on the wafer.

The above method as shown in FIG. 1 to make a mold plate filled with solder is well-known in the art and is not a part of this invention other than to provide the solder filled mold plate which is then used to transfer the solder from the mold plate to the capture pads of the wafer or other substrate which results in an empty mold plate containing tin residues.

Figure 2A:
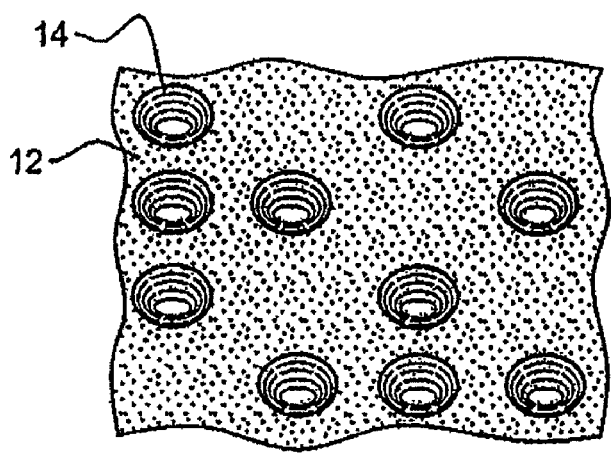
FIG. 2A is a plan view of a portion of a mold plate showing the mold cavities.

FIG. 2A shows a portion of a mold plate 12 having a number of cavities 14 therein.

Figure 2B:
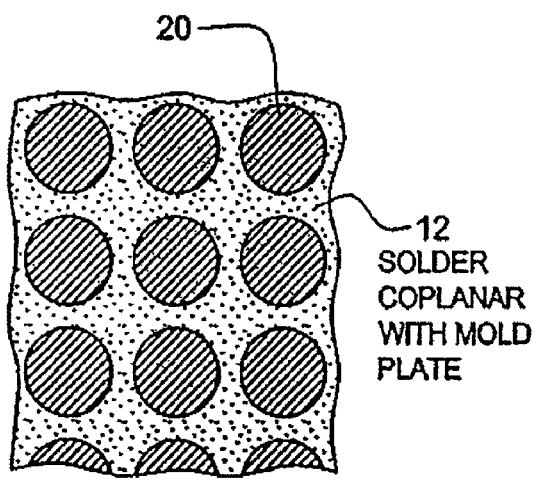
FIG. 2B is a plan view of the mold plate of FIG. 2A with the mold cavities filled with solder.

FIG. 2B shows a portion of a mold plate 12 which openings are filled with solder forming solder filled openings 20. The surface of the solder is coplanar with the mold plate.

Figure 2C:
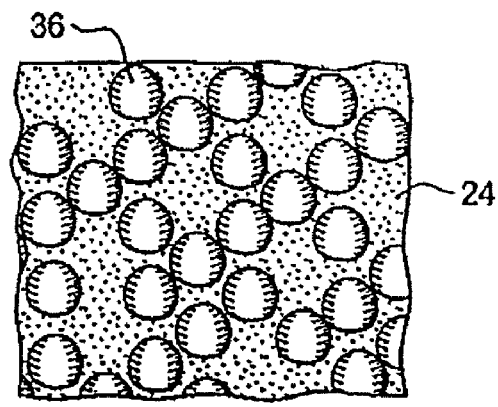
FIG. 2C is a top view of an electronic substrate containing the solder transferred from the mold to the surface thereof.

FIG. 2C shows the transfer of the solder from the mold plate to the wafer 24, the transferred solder 36 being in the inverted form of the solder which was in the mold cavities. A preferred solder shape is spherical.

Alignment of the mold and the transfer substrate, i.e., wafer, is critical to the success of wafer mold or bump transfer. When transparent mold plates are used, it is relatively easy to align solder filled cavities to wafer pads. When non-transparent material is used, or when a gaseous flux is used, alignment using split optics may be necessary. Depending upon the environment of the transfer, flux may or may not be used. If used, it can be applied in a thin even coat onto the filled mold plate or wafer before proceeding to the transfer fixture. Or it can be applied in the vapor phase at or near the solder transfer temperature. If not used, oxide reducing methods such as pressure variation or hydrogen reflow can help to facilitate the transfer. In general, when the solder in the mold plate is in a liquidus state and the wafer pads are oxide free, the solder wetting forces exceeds surface tension forces that maintain the molten solder in their cavities. After cooling to solidify the solder, the solder bumps are released from the mold plate onto the wafer pads and the mold plate is lifted from the wafer. The shape of the bumps on the wafer tends to be spherical, especially if the capture pad on which they are transferred is round. The wafer can now be independently subjected to a final solder reflow excursion after wafer test to obtain spherically shaped bumps on the wafer pads if test damage makes this necessary.

The present invention is particularly directed to removing residual tin from the empty mold after the solder transfer process.

Figure 3A:
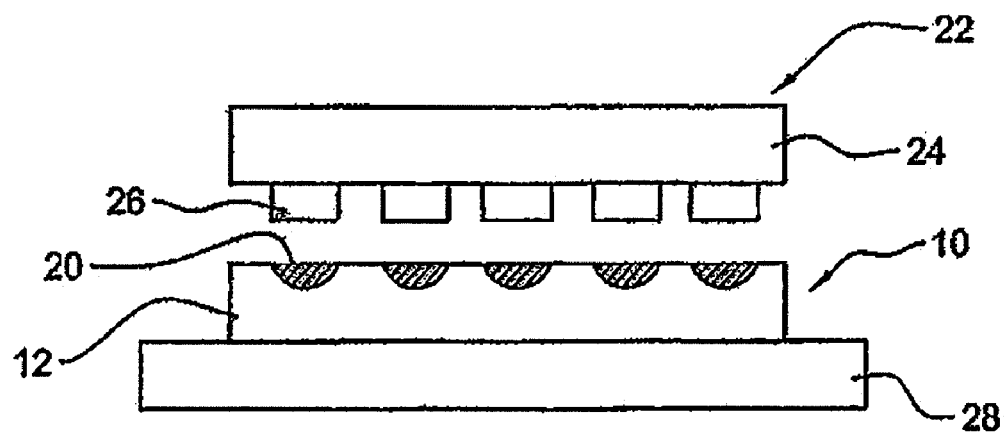
FIGS. 3A-3D are elevational, cross-sectional views of the C4NP process for transferring solder from a mold to the pads of a chip.
Figure 3B:
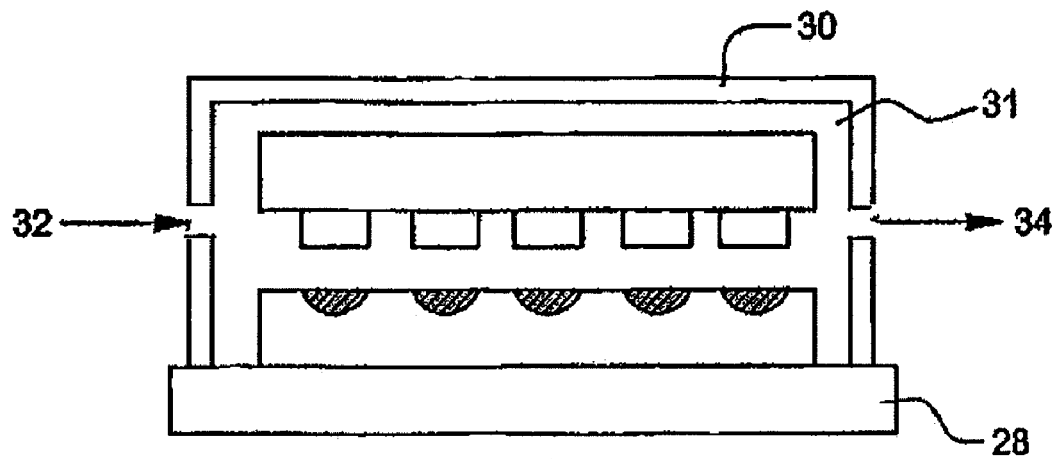
Figure 3C:
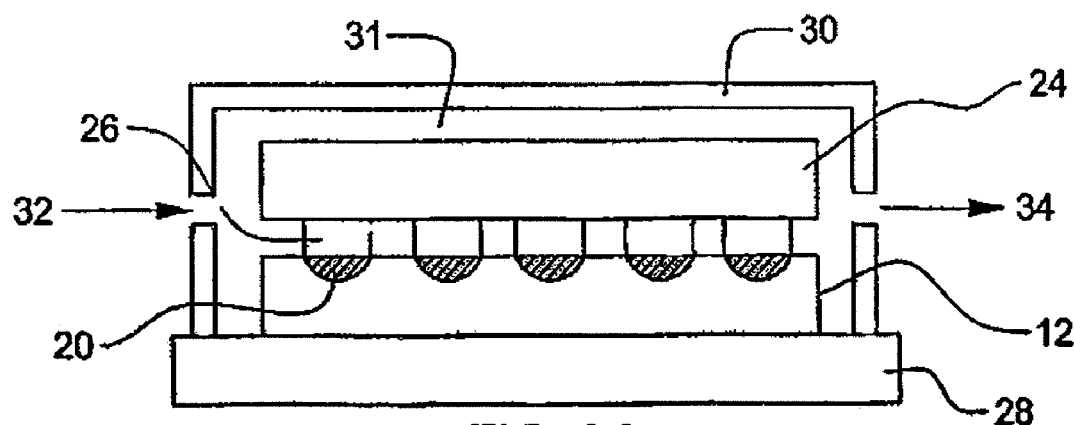
Figure 3D:
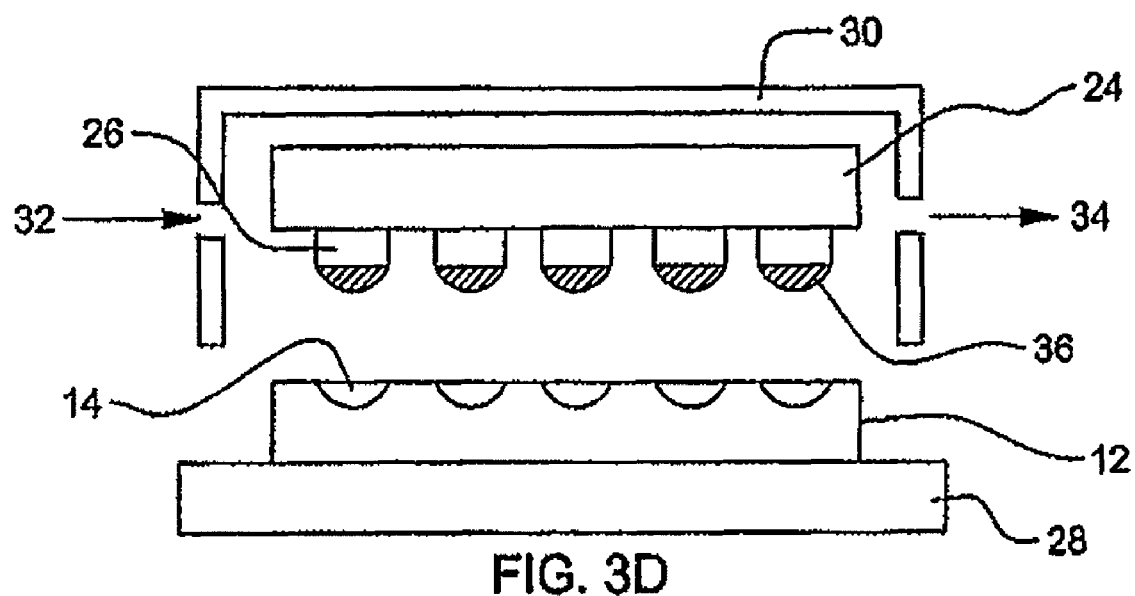

In FIG. 3A, a filled mold (containing the solder) 10 comprising a mold substrate 12 and solder filled cavities 20 and a wafer 22 are loaded into a solder transfer tool. The solder transfer tool comprises a base 28 on which the mold 10 is positioned. The wafer 22 is positioned above the mold and comprises a wafer substrate 24 having capture pads 26 thereon. The capture pads are in an array corresponding to an array in the mold. As shown in FIG. 3B, a temperature resistant seal ring 30 forms a confinement chamber 31 in which gases are injected through inlet 32 and removed by outlet 34. During heat up to an elevated temperature, e.g., 280° C., flowing nitrogen in the chamber prevents oxidation of the solder or the capture pads of the wafer. The elevated temperature is sufficient to liquefy the solder, and is preferably about 5 to 60° C. above the melting point of the solder. Any non-oxidizing gas may be used. The solder and wafer are brought together in FIG. 3C so that the solder preferably contacts the capture pads and the solder wets the capture pads and the solder is transferred from the mold to the wafer pad. After cool down, the wafer and seal are pulled away in FIG. 3D, leaving behind a solder bump 36, in the shape of a sphere, on each capture pad 26 of the wafer 24 and the empty mold 12.

The subject invention is particularly directed to methods to remove the residual tin solder contamination of the empty mold resulting from the C4NP transfer process.

The present invention uses an etching solution to etch the tin solder. This solution can be readily used in an immersion etch process and does not evolve $H_2$ gas during the etching process and does not result in etch rate non-uniformity as when using either the prior art $HNO_3$ or concentrated HCl based solutions in immersion processes as discussed above. The solution is aqueous and comprises cupric ions, preferably cupric chloride ($CuCl_2$) or CuSO4 and HCl. The HCl concentration is lower than the concentrated HCl referred to in the above prior art so the potential requirement for exhaust scrubbers to reduce environmental emissions is reduced. Additional components may be added to facilitate wetting of non-planar tin substrate surfaces or to suppress the formation of insoluble precipitates. An example of a suitable wetting agent for an acidic solution is Citrajet manufactured by Alconox Corporation. Regarding precipitate suppression, it has been noted in literature that aqueous solutions containing thiosulfate ions (e.g. sodium thiosulfate) will keep normally insoluble AgCl in solution. The tin holding capacity of the etching solutions of the invention is high, e.g., up to 500 g/l or above, so longer bath life is also indicated versus the commercially available $HNO_3$ based solutions.

The tin and tin alloy etching composition of the invention comprises:

about 0.5 to about 3 M or higher of a $Cu^{+2}$ source preferably $CuCl_2$ or $CuSO_4$, preferably 0.5 to 1 M;

about 0.5 to about 4 M or higher HCl preferably 2 to 3 M; and the balance essentially $H_2O$.

It is hypothesized that the chemical reactions occurring during the tin etch process can be described as follows:

(1) $Sn+CuCl_2 \rightarrow Cu+SnCl_2$ (copper plates on the Sn surface as Sn is going into solution as $SnCl_2$)

(2) $Cu+CuCl_2 \rightarrow 2CuCl$ (insoluble cuprous chloride film forms on the copper surface)

(3) $2CuCl+2HCl \rightarrow 2CuCl_2+2H$ (hydrochloric acid reacts with the cuprous chloride film to form cupric chloride which goes into aqueous solution)

The etching rate generally decreases as the $Cu^{+2}$ concentration decreases and the $Cu^{+1}$ concentration increases and it is preferred that the solution be periodically or continuously "regenerated" by oxidizing the $Cu^{+1}$ to $Cu^{+2}$ in order to maintain a suitable etch rate. This can be accomplished by, for example, bubbling air or oxygen through the solution or by the addition of a suitable oxidizer to the solution such as hydrogen peroxide ($H_2O_2$). The regeneration is preferably performed during the etching process.

The tin etchant solution can be installed in any common immersion tank. Vigorously bubbling air or $O_2$ through the solution in the tank is preferred because the solution agitation facilitates the removal of the insoluble cuprous chloride film and regenerates the solution by oxidizing $Cu^{+1}$ to $Cu^{+2}$.

The process of the invention is illustrated by the following example which is merely indicative of the nature of the present invention and it should not be construed as limiting the scope of the invention or of the appended claims in any manner.

A transfer mold used in the C4NP process which was filled with a SnAg solder was cleaned using an aqueous solution cupric chloride 0.75 M and HCl 3 M. The cleaning was performed at a temperature of 22° C. and the molds were pulled during the clean cycle at 0.5, 1, 2, and 10 minutes of clean time. Analysis of the mold at the 0.5 or 1 minute showed a residue composed of copper, $Ag_3Sn$, and Sn on the mold. Analysis also showed a dendritic growth in areas outside the mold cavity as well as in the mold and this growth was primarily copper with some tin. The 2 minute clean cycle was examined and showed 2 morphologies in the residue. Particles containing Cl and other areas containing Ag both with mixes of tin and copper were detected. The 10 minute clean mold showed acceptable commercial removal of tin and the mold could now be reused in the C4NP process.

It will be appreciated by those skilled in the art that the concentration of the cleaning solution and the time of exposure to the solution and temperature of the solution are interrelated for the effectiveness of removal of tin or tin alloy from the substrate surface. Typically, the conversion temperature can be about 15 to 30° C., preferably 20 to 25° C. for time period of up to 10 minutes or more. In general, the higher the concentration of the cleaning solution, the higher the immersion temperature of the solution and the time of immersion will increase the tin removal from the substrate surface. For the preferred cupric chloride solution of 0.75 M and HCl 3 M the preferred immersion temperature is 22° C. for a time period of greater than 2 minutes to 10 minutes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method is provided for removing tin solder residues from molds used in solder transfer processes such as the C4NP process comprising the steps of:
   providing a mold containing an array of openings (cavities) corresponding to an array of capture pads on a substrate surface such as a wafer surface, the openings being filled with a tin-containing solder;
   positioning the openings in the mold and the capture pads of the substrate surface so that the solder in the mold can be transferred to the corresponding capture pad on the substrate;
   transferring the solder in the mold to the corresponding capture pads of the substrate leaving an empty mold;
   removing the empty mold from the substrate;
   removing residual tin from the mold by immersing the empty mold within an aqueous composition comprising cupric ions and HCl for an effective time and temperature to remove the tin from the mold, wherein the cupric ions are in an amount of about 0.5 M to 3.0 M and the HCl in an amount of about 0.5 M to about 4.0 M and the effective temperature ranges from about 15 to 30° C.; and
   providing air or oxygen into the aqueous composition during the etching process to both agitate the aqueous composition to facilitate removal of insoluble cuprous chloride film and to regenerate the aqueous composition by oxidizing $Cu^{+1}$ to $Cu^{+2}$ thereby maintaining a suitable etch rate.

2. The method of claim 1 wherein the cupric ions are provided by cupric chloride or cupric sulfate.

3. The method of claim 1 wherein the cupric ions are about 0.5 M to 1.0 M and the HCl about 2 M to 3 M, the effective temperature ranges from about 20 to 25° C. for the effective time ranging from greater than 2 minutes to about 10 minutes.

4. The method of claim 1 wherein the composition contains a wetting agent.

5. The method of claim 1 wherein the aqueous composition is continuously regenerated by continuously providing air or oxygen into the aqueous composition.

6. The method of claim 1 wherein the aqueous composition is periodically regenerated by periodically providing air or oxygen into the aqueous composition.

7. The method of claim 1 wherein the balance of the aqueous composition comprises essentially $H_2O$.

8. The method of claim 1 wherein the effective time is up to 10 minutes.

9. The method of claim 1 wherein the residual tin is removed using the aqueous composition comprising a solution of 0.75 M cupric chloride and 3 M HCl, the balance essentially $H_2O$, at a temperature of about 22° C. for a time period of greater than 2 minutes to 10 minutes.

10. A method for removing tin or tin alloy residues from a substrate comprising the steps of:
    providing a substrate containing tin residues;
    immersing the substrate within an aqueous composition comprising cupric ions and HCl for an effective time and temperature to remove the tin or tin alloy residues from the substrate, wherein the cupric ions are in an amount of about 0.5 M to 3.0 M and the HCl in an amount of about 0.5 M to about 4.0 M and the effective temperature ranges from about 15 to 30° C.; and
    providing air or oxygen into the aqueous composition during the etching process to both agitate the aqueous composition to facilitate removal of insoluble cuprous chloride film while simultaneously regenerating the aqueous composition by oxidizing $Cu^{+1}$ to $Cu^{+2}$ thereby maintaining a suitable etch rate.

11. The method of claim 10 wherein the cupric ions are provided by cupric chloride or cupric sulfate.

12. The method of claim 10 wherein the cupric ions are about 0.5 M to 1.0 M and the HCl about 2 M to 3 M, the effective temperature ranges from about 20 to 25° C. for the effective time ranging from greater than 2 minutes to about 10 minutes.

13. The method of claim 10 wherein the composition contains a wetting agent.

14. The method of claim 10 wherein the aqueous composition is continuously regenerated by continuously providing air or oxygen into the aqueous composition.

15. The method of claim 10 wherein the aqueous composition is periodically regenerated by periodically providing air or oxygen into the aqueous composition.

16. The method of claim 10 wherein the balance of the aqueous composition comprises essentially $H_2O$.

17. The method of claim 10 wherein the effective time is up to about 10 minutes.

18. The method of claim 10 wherein tin or tin alloy residues is removed using the aqueous composition comprising a solution of 0.75 M cupric chloride and 3 M HCl, the balance essentially $H_2O$, at a temperature of about 22° C. for a time period of greater than 2 minutes to about 10 minutes.

* * * * *